United States Patent
Ming-Jiunn et al.

[11] Patent Number: 6,078,064
[45] Date of Patent: Jun. 20, 2000

[54] INDIUM GALLIUM NITRIDE LIGHT EMITTING DIODE

[75] Inventors: Jou Ming-Jiunn; Lee Biing-Jye; Jacob C. Tarn; Chang Chuan-Ming; Liu Chia-Cheng, all of Hsin-Chu, Taiwan

[73] Assignee: Epistar Co., Hsin-Chu, Taiwan

[21] Appl. No.: 09/071,519

[22] Filed: May 4, 1998

[51] Int. Cl.[7] .................................................. H01L 33/00
[52] U.S. Cl. .......................... 257/103; 257/94; 257/101
[58] Field of Search ............................................. 257/103

[56] References Cited

U.S. PATENT DOCUMENTS

| | | | |
|---|---|---|---|
| 5,369,289 | 11/1994 | Tamaki et al. | 257/99 |
| 5,684,523 | 11/1997 | Satoh et al. | 347/247 |
| 5,789,265 | 8/1998 | Nitta et al. | 437/228 |
| 5,798,537 | 8/1998 | Nitta | 257/103 |
| 5,880,486 | 3/1999 | Nakamura et al. | 257/96 |
| 5,923,690 | 7/1999 | Kume et al. | 372/46 |

*Primary Examiner*—Olik Chaudhuri
*Assistant Examiner*—Douglas A. Wille
*Attorney, Agent, or Firm*—Hung C. Lin, Patent Agent

[57] ABSTRACT

A transparent conductive layer is deposited between the electrode and the semiconductor diode to spread the current evenly to the diode and to reduce the series resistance. Tin indium oxide can be used as the transparent conductive layer. The transparent conductive layer is particularly applicable to a blue light emitting diode, where InGaN is used as the light emitting layer.

20 Claims, 5 Drawing Sheets

INDIUM GALLIUM NITRIDE LIGHT EMITTING DIODE

BACKGROUND OF THE INVENTION

This invention is related to light emitting diode, in particular indium gallium nitride light emitting diode.

In the III-V compound semiconductor family, the nitrides have the highest direct bandgap. The light emitting wavelength lies in the ultra-violet to yellow color range. The material is suitable for fabricating short-wavelength, high efficiency light emitting devices. Although a great deal of effort have been devoted to commercialize the product, the goal has not been achieved due to the following reasons:

1. No suitable substrate material to match the crystalline structure of the nitride material.
2. Difficulty in growing indium-gallium-nitride (InGaN), especially that with high indium content.
3. Difficulty of growing high p-type GaN materials;
4. Difficulty in forming good electrode contact to the material.

Not until the end of 1993 did the Nichia Chemical Industries Ltd. in Japan announce the successful fabrication of a blue light emitting diode using gallium nitride as the basic material. Afterwards, a high intensity green light emitting diode was also developed. At present, many research organizations have invested a large amount of resources to pursue such development, but only a few two and three companies have achieved any success. The foregoing difficulties are the bottlenecks.

As shown in FIG. 1, the Nichia Chemical Industries disclosed in a paper that the InGaN light emitting diode uses a sapphire substrate 18, a GaN nucleation layer 17A, an n-type GaN buffer layer 16, an n-type GaN cladding layer 15, a InGaN quantum well light emitting layer 14, a p-type aluminum-gallium-nitride cladding layer 13, a p-type GaN contact layer, a nickel-gold (Ni/Au) light transmitting electrode 11A, a p-type Ni/Au electrode 10. Due to the fact that the sapphire is an insulator, the light emitting die is Selectively etched to the n-type GaN cladding layer 16 and forms an n-type titanium/aluminum electrode 19.

The p-type GaN contact layer 12, after thermal annealing, usually has a carrier concentration of less than $1 \times 10^{18}$ cm$^{-3}$. The lowest resistivity is no lower than 1 ohm-cm Such poor conductivity cannot effectively distribute the current over the entire semiconductor die and causes a current crowding phenomenon which lowers the light emitting efficiency.

The prior art shown in FIG. 1 uses a very thin Ni/Au layers 11A. The thickness is only few hundred Angstroms as a current spreading layer to effectively spread the current over the entire die. However, such a Ni/Au layer 11A has a transmittance of less than 50%. Thus, the major portion of the light emitted from the light emitting diode is absorbed by the current spreading layer to lower the light emitting efficiency.

SUMMARY

An object of the present invention is to increase the light emitting efficiency of a InGaN light emitting diode. Another object of the present invention is to reduce the series resistance of a InGaN light emitting diode. Still another object of the present invention is to increase the transmission efficiency of the current spreading layer of a InGaN light emitting diode.

These objects are achieved by using a high conductivity transparent layer as a light transmitting electrode in place of the conventional Ni/Au layer. Such a transparent layer is implemented with a kind of oxide layer with resistivity of $3 \times 10^{-4}$ ohm-cm. Such a layer has high current spreading capability and light transmission coefficients of over 90% in the visible light range.

DETAILED DESCRIPTION OF THE PREFERRED EMBODIMENTS

Figure 1:
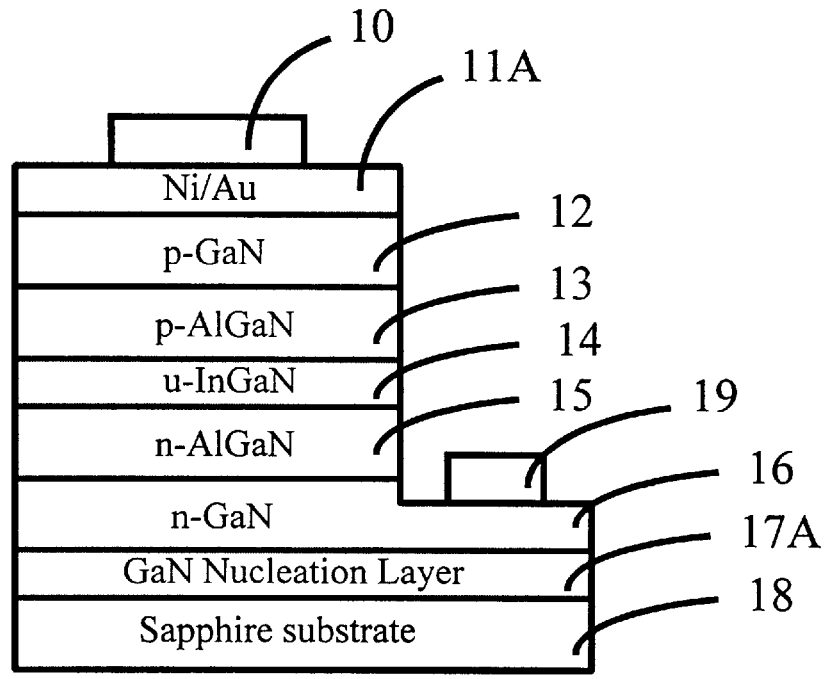
FIG. 1 shows the a prior art InGaN light emitting diode structure.
Figure 2:
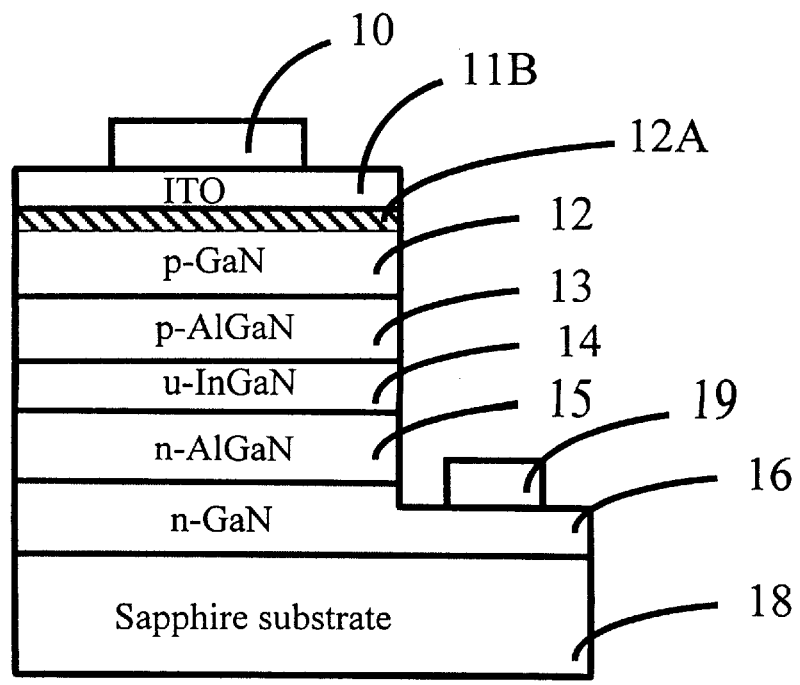
FIG. 2 shows a first embodiment of the InGaN light emitting diode of the present invention.

FIG. 2 shows the structure of the first embodiment of the present invention. Indium-tin oxide (ITO) 11B is used instead of the Ni/Au layer 11A in FIG. 1 as a current spreading layer. The ITO 11B has a light transmission coefficient of over 90% in the light wavelength range of 400–900 nm, while the light transmission coefficient of Ni/Au has only a light transmittance of less than 50%. Therefore, the ITO layer does not absorb the light emitted from the diode. Compared with the conventional Ni/Au material, the transmission efficiency of the present invention is improved by a factor of two. The conductive oxide layer 11B can be composed of indium oxide, tin oxide or indium tin oxide.

Due to lower than $1 \times 10^{18}$ cm$^{-3}$ carrier concentration of p-GaN, good contact between p-GaN and the ITO cannot be obtained. Theory and experiment have shown that when a contact layer with a carrier concentration exceeding $5 \times 10^{18}$ cm$^{-3}$ and a thickness of few hundred Angstroms, good contact can be achieved through tunneling effect. The operating voltage can thus be reduced. The present invention uses a GaN contact layer with a concentration of greater than $5 \times 10^{18}$ cm$^{-3}$ and a thickness of less than 500 Angstroms.

The contact layer 12A can be formed by zinc (Zn) diffusion, magnesium (Mg) diffusion, Zn ion implantation, or Mg ion implantation, etc., to the contact layer. This forms a very thin but high concentration contact layer 12A. When a transparent conductive oxide film 11B is deposited over the contact layer 12 by sputtering or e-gun evaporation, the voltage drop across the contact can be reduced. The contact layer 12 can also be fabricated with the following material: aluminum-gallium-nitride (AlGaN), gallium nitride (GaN), indium-gallium nitride (InGaN), or aluminum-gallium-indium nitride (AlGaInN).

The substrate uses transparent insulating material, including sapphire ($Al_2O_3$), lithium-gallium oxide ($LiGaO_2$), lithium aluminum oxide ($LiAlO_2$) or spinel ($MgAl_2O_4$).

Figure 3:
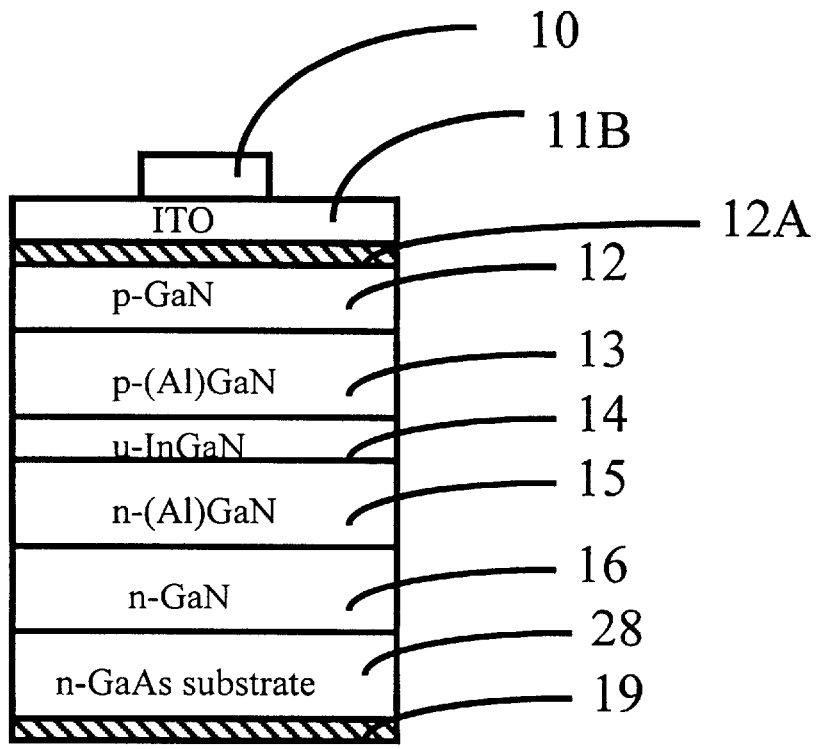
FIG. 3 shows the second embodiment of the InGaN light emitting diode of the present invention.

FIG. 3 shows a second embodiment of the present invention. As shown in FIG. 3, the substrate is an n-type silicon carbide semiconductor material and the n-type electrode 19 can be formed underneath the substrate 28. The p-type electrode 10 is formed over the conductive transparent oxide thin film 11B. The substrate material can also be gallium arsenide (GaAs) or silicon (Si) instead of silicon carbide 28.

Figure 4:
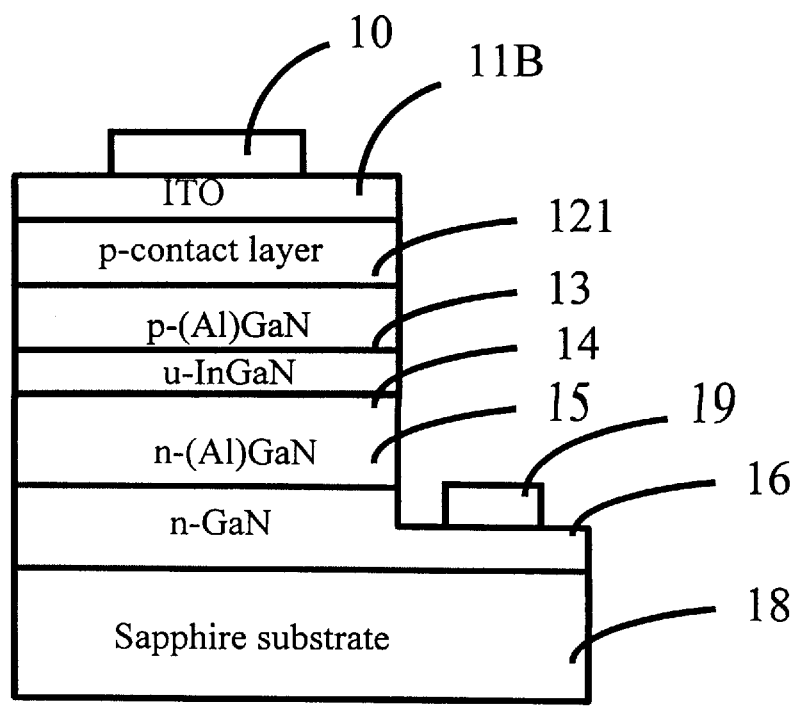
FIG. 4 shows the third embodiment of the InGaN light emitting diode of the present invention.

FIG. 4 shows a third embodiment of the present invention. The difference between this structure and that of FIG. 2 is that a contact layer 121 is inserted between the the AlGaN cladding layer 13 and the ITO current spreading layer 11B. The feature of this contact layer 121 is that the carrier concentration is in excess of $5*10^{18}$ cm$^{-3}$ and thickness is under 500 Angstroms. The ideal contact layer should have at least one layer of InGaN, GaAs, AlGaAs, gallium phosphide (GaP), or gallium arsenide phosphide (GaAsP). Although the bandgap of these material is smaller than GaN, hence having the drawback of light absorption, the thickness of the contact layer 121 is only around 500 Angstroms and has a transmission coefficient of approximately 95%. Together with the ITO, the overall transmission coefficient of 85% can be achieved. Thus, by replacing the prior art Ni/Au with ITO as a current spreading layer, a light emitting efficiency of more than 70% can be obtained.

Figure 5:
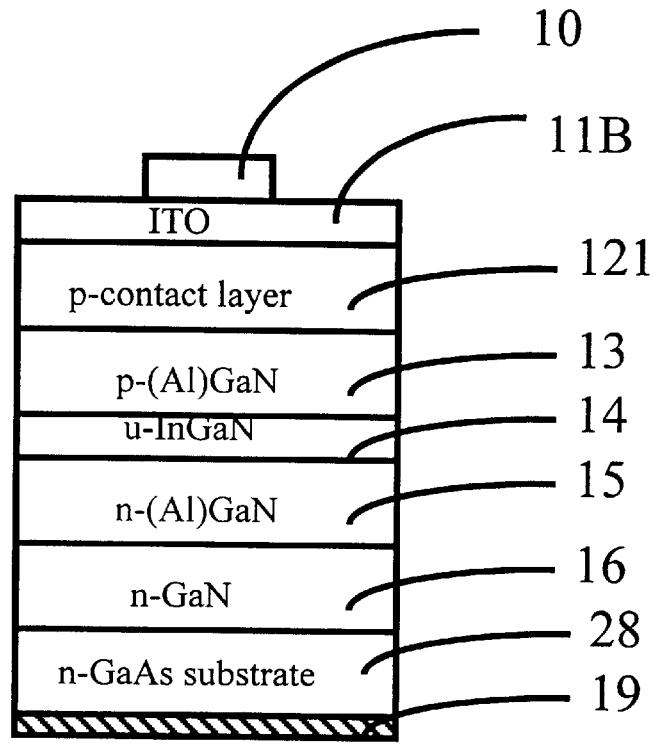
FIG. 5 shows the fourth embodiment of the InGaN light emitting diode of the present invention.

FIG. 5 shows a fourth embodiment of the present invention. The difference between FIG. 5 and FIG. 3 is the addition of a contact layer 121 between the AlGaN layer 12 and the current spreading layer 11B. This contact layer can be made of InGaN, GaAs, AlGaAs, GaP or GaAsP.

Figure 6:
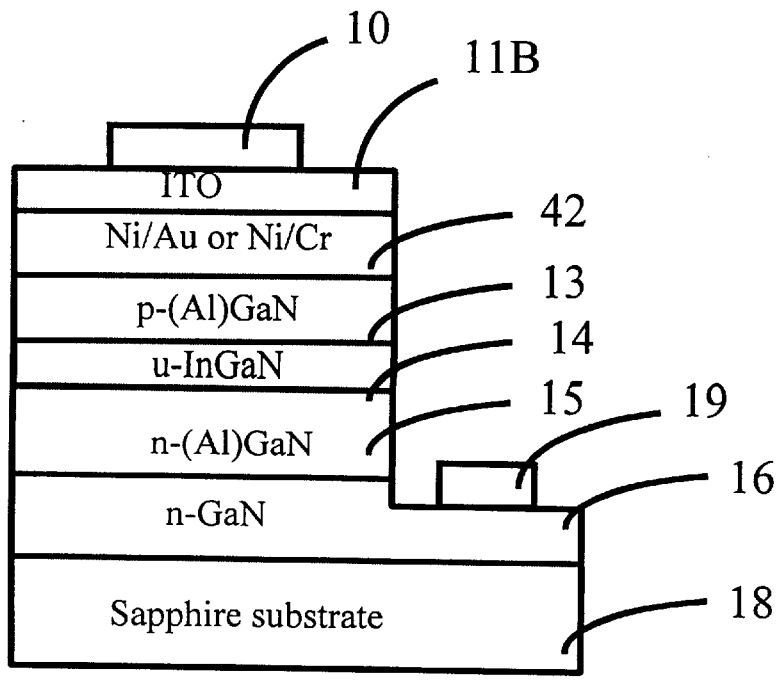
FIG. 6 shows the fifth embodiment of the InGaN light emitting diode of the present invention.
Figure 7:
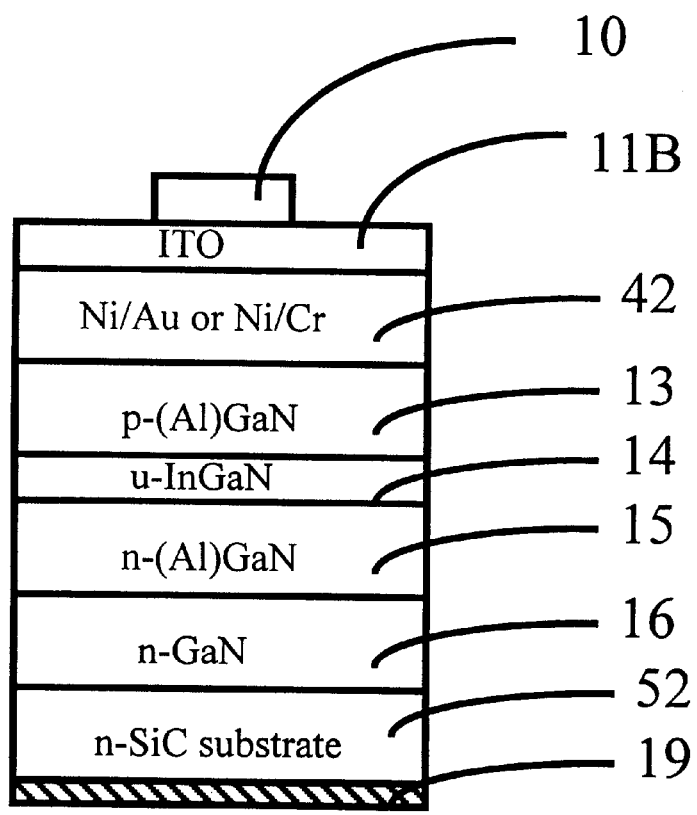
FIG. 7 shows the sixth embodiment of the InGaN light emitting diode of the present invention.

FIGS. 6 and 7 show the fifth and sixth embodiments of the present invention. The difference from FIG. 4 is that a contact layer 42 made of very thin metal is inserted between the (Al) GaN cladding layer 13 and its current spreading layer 11B. This thin metal layer 42 can be made of Ni/Au or Ni/Cr. The thickness is in the range of 10–100 Angstroms. In FIG. 7, the SiC substrate material can be replaced with GaAs or Si.

Figure 8:
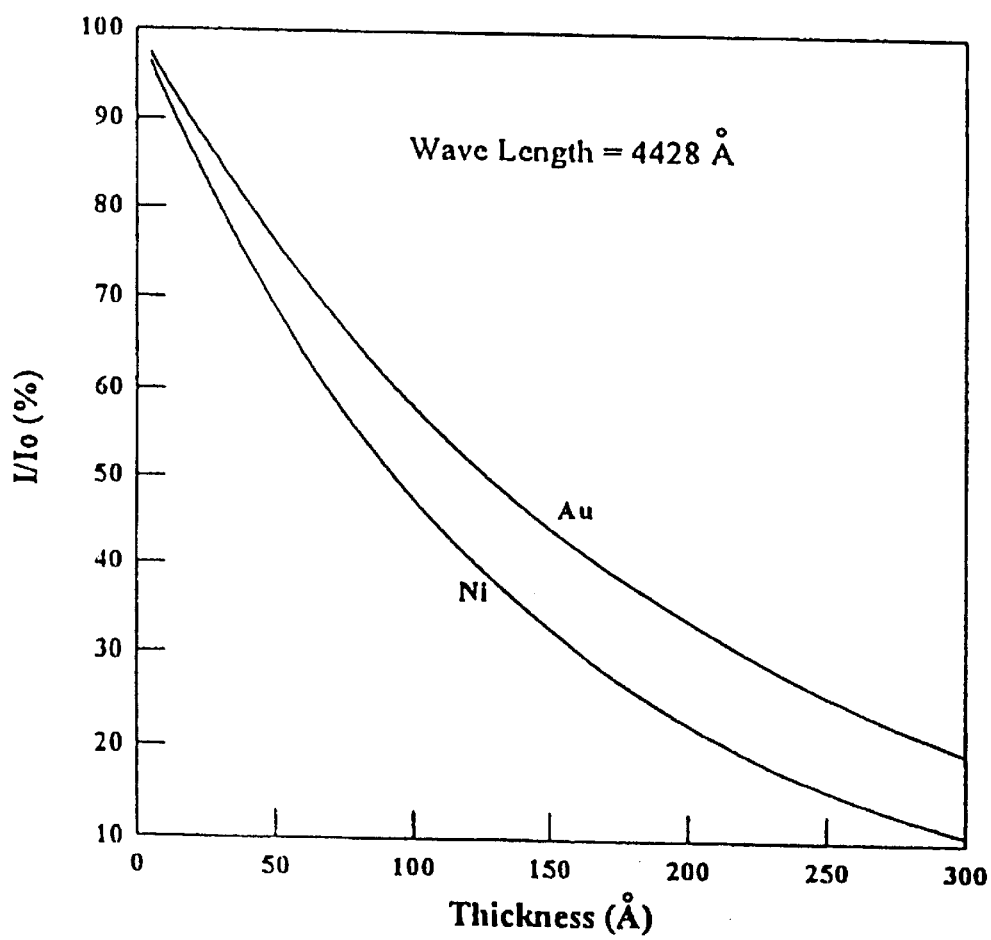
FIG. 8 shows the relationship between transmission coefficient and thickness for Au/Ni.

FIG. 8 shows the theoretical transmittance of the Ni/Au as a function of thickness. When the thickness is less than 100 Angstroms, the transmission coefficient is high. However, when the thickness is too thin, the layer tends to granulate or "ball" into islands and forms discontinuous layer. Then, the current from the electrode 10 cannot effectively distribute to all parts of the chip. For this reason, in conventional practice, the thickness of the Ni/Au layer must be several hundred Angstroms thick. In so doing, the transmission coefficient cannot be high. FIG. 6 shows a structure to overcome this drawback. A very thin layer of Ni/Au 42, less than 100 Angstroms is first evaporated over the cladding layer 13, and followed by another layer of transparent conductive ITO 11B. The Ni/Au layer 43 serves as a contact layer for the transparent ITO 11B and the GaN cladding layer. Due to the high conductivity of the ITO, the current flowing down from the electrode 10 can distribute uniformly over the entire chip, thus increasing the light emitting efficiency.

While the preferred embodiments of the invention have been shown and described, it will be apparent to those skilled in this art that various modifications may be made in the embodiments without departing from the spirit of the present invention. Such modifications are all within the scope of this invention.

What is claimed is:

1. A light emitting diode, comprising:
    a transparent insulating substrate;
    a first conductivity type GaN as a buffer directly over said transparent insulating substrate;
    a first conductivity type (Al)GaN as a lower cladding layer directly over said first conductivity type GaN;
    an InGaN light-emitting layer directly over said first conductivity type (Al)GaN;
    a second conductivity type semiconductor material as a contact layer directly over said InGaN light-emitting layer;
    a second contact layer with a carrier concentration greater than $5*10^{18}$ cm$^{-3}$ and a thickness of less than 500 Angstroms directly over said second conductivity type semiconductor material;
    a transparent conductive layer selected from the group consisting of indium tin oxide (ITO), tin oxide and indium oxide as a current spreading layer for reducing the spreading resistance of the light emitting diode directly over said second contact layer;
    a first electrode formed on the partially exposed area of the first conductivity type GaN; and
    a second electrode formed on top of the transparent conductive layer.

2. A light emitting diode as described in claim 1, wherein said second conductivity type semiconductor material is selected from the group consisting of AlGaN, GaN, InGaN and AlGaInN.

3. A light emitting diode as described in claim 2, wherein said second contact layer is fabricated by a technology selected from the group consisting of zinc diffusion, magnesium diffusion, zinc ion implantation, and magnesium ion implantation to said second conductivity type semiconductor material.

4. A light emitting diode as described in claim 2, wherein said second contact layer is selected from the group consisting of InGaN, AlGaAs, GaP, GaAs and GaAsP.

5. A light emitting diode as described in claim 3, wherein said substrate is selected from a group consisting of $Al_2O_3$, $LiGaO_2$, $LiAlO_2$ and $MgAl_2O_4$.

6. A light emitting diode, comprising:
    a first conductivity semiconductor as a substrate;
    a first conductivity type GaN as a buffer layer directly over said substrate;
    a first conductivity type (Al)GaN as a lower cladding layer directly over said buffer layer;
    an InGaN light emitting layer directly over said lower cladding layer;
    a second conductivity type (Al)GaN as an upper cladding layer directly over said light emitting layer;
    a second conductivity type semiconductor material as a contact layer directly over said upper cladding layer;
    a second contact layer with carrier concentration greater than $5*10^{18}$ cm$^{-3}$ and a thickness of less than 500 Angstroms directly over said contact layer;
    a transparent conductive layer as a current spreading layer for reducing the spreading resistance of the light emitting diode directly over said second contact layer;
    a first electrode formed underneath the first conductivity type substrate; and
    a second electrode formed on top of the transparent conductive layer.

7. A light emitting diode as described in claim 6, wherein said second conductivity type semiconductor material is selected from the group consisting of AlGaN, GaN, InGaN and AlGaInN.

8. A light emitting diode as described in claim 7, wherein said second contact layer is fabricated by a technology selected from the group consisting of zinc diffusion, magnesium diffusion, zinc ion implantation, and magnesium ion implantation to said second conductivity type semiconductor material.

9. A light emitting diode as described in claim 6, wherein said second contact layer is selected from the group consisting of InGaN, GaP, GaAs, AlGaAs and GaAsP.

10. A light emitting diode as described in claim 6, wherein said first conductivity type substrate is se group consisting of SiC, GaAs, and Si.

11. A light emitting diode, comprising:
a transparent insulating substrate;
a first conductivity type GaN as a buffer layer directly over said substrate;
a first conductivity type (Al)GaN as a lower cladding layer directly over said buffer layer;
an InGaN light emitting layer directly over said light emitting layer;
a second conductivity type (Al)GaN as an upper cladding layer directly over said light emitting layer;
a transparent conductive metal layer as a contact layer with a thickness in the range of 10–100 Angstroms directly over said upper cladding layer;
a transparent conductive layer as a current spreading layer directly over said contact layer;
a first electrode formed on a partially exposed area of first conductivity type GaN directly over said transparent conductive layer; and
a second electrode formed on top of the transparent conductive layer.

12. A light emitting diode as described in claim 11, wherein said transparent conductive layer is composed of material selected from a group consisting of: indium tine oxide (ITO), tin oxide, and indium oxide.

13. A light emitting diode as described in claim 11, wherein said transparent conductive metal layer is selected from a group consisting of Ni/Au and Ni/Cr.

14. A light emitting diode as described in claim 11, wherein said transparent conductive metal layer has a thickness of between 10 and 100 Angstroms.

15. A light emitting diode as described in claim 11, wherein said transparent insulating substrate is selected from a group consisting of $Al_2O_3$, $LiGaO_2$, $LiAlO_2$, and $MgAl_2O_4$.

16. A light emitting diode, comprising:
a first conductivity type semiconductor as a substrate;
a first conductivity type GaN as a buffer layer directly over said substrate;
a first conductivity type (Al)GaN as a lower cladding layer directly over said buffer layer;
an InGaN light emitting layer directly over said lower cladding layer;
a second conductivity type (Al) GaN as an upper cladding layer directly over said light emitting layer;
a transparent conductive metal layer as a contact layer with a thickness in the range of 10–100 Angstroms directly over said upper cladding layer;
a transparent conductive layer as a current spreading layer directly over said contact layer;
a first electrode formed underneath said substrate; and
a second electrode formed on top of the transparent conductive layer.

17. A light emitting diode as described in claim 16, wherein said transparent conductive layer is selected from a group consisting of indium tine oxide (ITO), tin oxide, and indium oxide.

18. A light emitting diode as described in claim 16, wherein said transparent conductive metal layer is selected from a group consisting of Ni/Au, and Ni/Cr.

19. A light emitting diode as described in claim 16, wherein said transparent conductive metal layer has a thickness of between 10 and 100 Angstroms.

20. A light emitting diode as described in claim 16, wherein said first conductivity type substrate is selected from a group consisting of: SiC, GaAs, and Si.

* * * * *